United States Patent [19]

Kawashima et al.

[11] Patent Number: 5,482,603

[45] Date of Patent: Jan. 9, 1996

[54] METHOD OF PRODUCING ELECTROLUMINESCENCE EMITTING FILM

[75] Inventors: Tomoyuki Kawashima; Harutaka Taniguchi; Hisato Kato; Kazuyoshi Shibata, all of Kanagawa, Japan

[73] Assignee: Fuji Electric Co., Ltd., Kanagawa, Japan

[21] Appl. No.: 55,104

[22] Filed: May 3, 1993

[30] Foreign Application Priority Data

May 7, 1992 [JP] Japan ..................... 4-113833

[51] Int. Cl.$^6$ .................................. C23C 14/34
[52] U.S. Cl. ................. 204/192.26; 204/192.15; 204/192.29
[58] Field of Search ............... 204/192.28, 192.27, 204/192.26, 192.15, 192.14, 192.29

[56] References Cited

U.S. PATENT DOCUMENTS

| | | | |
|---|---|---|---|
| 4,675,092 | 6/1987 | Baird et al. | 204/192.26 |
| 4,725,344 | 2/1988 | Yocom et al. | |
| 4,900,584 | 2/1990 | Tuenge et al. | 427/66 |
| 5,006,365 | 4/1991 | Nire et al. | 427/66 |

FOREIGN PATENT DOCUMENTS

| | | |
|---|---|---|
| 0239120A2 | 9/1987 | European Pat. Off. |
| 0421494A2 | 4/1991 | European Pat. Off. |
| 60-202684 | 10/1985 | Japan. |
| 61-42893 | 3/1986 | Japan. |
| 61-214395 | 9/1986 | Japan. |
| 61-256588 | 11/1986 | Japan. |
| 61-264698 | 11/1986 | Japan. |
| 61-260593 | 11/1986 | Japan. |
| 62-140395 | 6/1987 | Japan. |
| 63-29488 | 2/1988 | Japan. |
| 63-230871A | 9/1988 | Japan. |
| 63-250456A | 10/1988 | Japan. |
| 63-294694 | 12/1988 | Japan. |
| 2-338887A | 2/1990 | Japan. |
| 2-135696A | 5/1990 | Japan. |
| 2235089 | 2/1991 | United Kingdom. |

Primary Examiner—R. Bruce Breneman
Assistant Examiner—Rodney G. McDonald
Attorney, Agent, or Firm—Finnegan, Henderson, Farabow, Garrett & Dunner

[57] ABSTRACT

A method of making electroluminescence emitting films each containing sulfide such as Sr, Ca, etc. as a base material and a rare earth element such as Ce, Eu, Pr, etc. as an emitting center by sputtering method, so that the electroluminescence emitting film can produce with high luminance and with various emission light colors. In the method, an element such as Sr to be sulfidized for a base material is used as a target. A sputtering gas such as Argon to be supplied to a sputtering apparatus is mixed with an $H_2S$ gas as a base material sulfur compound. A rare earth element compound such as tris-cyclopentadienyl-cerium for an emitting center is gasified by a gas generator while being heated under supply of a carrier gas such as Ar, so that the gasified rare earth element compound is added to the sputtering gas. In the abovementioned condition, an electroluminescence emitting film is produced on a display panel by a high frequency sputtering method in a sputtering atmosphere of the sputtering gas containing sulfur for the base material and a rare earth element for the emitting center.

6 Claims, 3 Drawing Sheets

METHOD OF PRODUCING ELECTROLUMINESCENCE EMITTING FILM

BACKGROUND OF THE INVENTION

The present invention relates to a method of producing an electroluminescence (hereinafter referred to as "EL") emitting film containing sulfide of Sr, Ca, Zn, etc. as a base material and a rare earth element such as Ce, Eu, Pt, etc. as an emitting center and being adapted to integration into a thin-film lamination structure type EL display panel or the like.

As well known, an EL display panel has characteristic of self emission. Particularly, the EL display panel of a thin-film lamination type can display a variable image not only highly densely on a large-sized screen but sharply at a high luminance. Use of this type EL display panel as a display unit in the field of Office Automation apparatus, small-sized computers, etc. has been widened rapidly. In this type EL display panel which has been put into practical use, in most cases, used is an EL emitting film which contains zinc sulfide as a base material and a slight amount of manganese as an emitting center and which emits a yellowish green light. Though known well, the outline of the structure of this type EL display panel will be described briefly with reference to FIG. 6.

FIG. 6 is an enlarged sectional view of a peripheral portion of a thin-film lamination structure type EL display panel 10. A plurality of front-surface electrode films 12 made of transparent electrically conductive films are provided on a surface of a substrate 11 made from transparent glass so that they extend back and forth in this drawing and are arranged left and right in this drawing so as to be shaped like a pattern of stripes. After the front-surface electrode films 12 are covered with an insulating film 13, an EL emitting film 14 containing manganese-including zinc sulfide, etc. is produced. After the EL emitting film 14 is covered with an insulating film 15, a plurality of rear-surface electrode films 16 made from aluminum are provided so that they extend left and right and are arranged back and forth so as to be shaped like a pattern of stripes. Display voltages switched between positive values and negative values by one frame period are supplied between the front-surface electrode films 12 and the rear-surface electrode films 16 from a display drive circuit 1 to thereby perform display on the display panel 10. As a result, portions of the emitting film 14 constituted by intersection points of the two kinds of electrode films 12 and 16 perpendicular to each other perform EL emission as pixels respectively. Accordingly, the EL emission light is taken out as display light DL from the transparent front-surface electrode film side.

In the case where the emitting film 14 only contains the above-mentioned manganese-including zinc sulfide, it is a matter of course that color display cannot be performed because the emission light color is limited. For this reason, there are attempts to produce EL emitting films which use sulfides of strontium Sr, calcium Ca, etc. as a base material and are added with rare earth elements such as cerium Ce, europium Eu, praseodymium Pr, etc. as an emitting center to thereby exhibit various emission light colors. As methods of producing such films, there are mainly known an electron beam evaporation method, a CVD method and a sputtering method.

As well known, in the electron beam evaporation method, an electron beam is applied to an evaporation source prepared by adding an emitting center element to a base material to heat the evaporation source locally to thereby evaporate the evaporation source rapidly. In the CVD method, a gasified compound containing a base material element and an emitting center element as a raw material gas is decomposed in an atmosphere of plasma or the like. In the sputtering method, a surface portion of a base material containing an emitting center element as a target is hit with a sputtering gas to thereby make the target fly. As a result, the evaporated, decomposed or flying matter is accumulated as an EL emitting film.

When EL emitting films having various emission colors are to be produced, the above-mentioned methods have respective problems.

The electron beam evaporation method has performance upon production of the above-mentioned emitting film of zinc sulfide including manganese added thereto and has an advantage in that the chemical composition of the emitting film is exact so that the distribution of the emitting center element in the film is uniform. When the electron beam evaporation method is however applied to production of the EL emitting film containing, as a base material, sulfide of Sr or Ca added with a rare earth element, the evaporation source heated rapidly is apt to be evaporated in the form of massive particles and deposited in this form. As a result, particles with the size of several microns [μm] are mixed into the emitting film so that the surface of the emitting film becomes greatly rough. There is a tendency that breakdown of the insulation film being in contact with the projecting portion of the emitting film is caused by concentration of electric field to the projecting portion of the emitting film when display voltages are supplied. Further, in this method, the point of evaporation of the evaporation source is limited to a local portion which can be heated by means of an electron beam. Accordingly, in the case of a large-area display panel with the diagonal size of 20 inches or larger, it is very difficult to produce the emitting film uniform in thickness on the surface of the display panel.

In the CVD method, there is no problem in mixing of large particles into the emitting film. In the CVD method, there is however the largest problem that the film-producing speed is so low that the method cannot be adapted to mass production. Further, it is practically difficult to produce a large-area emitting film uniform in film quality by this method.

On the contrary, in the sputtering method, the material is made to fly from the whole surface of the target in the form of fine particles or molecules and deposited on the emitting film. As a result, there is no mixing of large particles into the emitting film, so that a large-area film uniform in film thickness and film quality can be produced. Accordingly, the film-producing speed is so high that this method can be adapted to mass production. It is therefore thought of that the sputtering method is a most promising method for production of emitting films exhibiting various emission light colors.

In the conventional sputtering method, it is however difficult to produce a high-luminance emitting film because shortage of sulfur at the surface portion of the target is caused by the high vapor pressure of sulfur contained in sulfide of the base material so that the base material on which the emitting film is produced is apt to be a sulfur-defective composition departing from the stoichiometric and accordingly deteriorated in crystalline characteristic. It is further difficult to control the rare earth element concentration of the emitting film, because the sputtering rate of the base material is different from that of the rare earth element so that the rare earth element concentration of the emitting film becomes different from that of the target.

SUMMARY OF THE INVENTION

An object of the present invention is to produce emitting films having various emission light colors with a high luminance by a sputtering method while the original advantage of the sputtering method is utilized.

In production of an EL emitting film containing sulfide as a base material and a rare earth element as an emitting center by means of sputtering as described above, according to the first aspect of the invention, an emitting film is deposited with use of an element to be sulfidized for the base material as a target in an atmosphere of a sputtering gas mixed with a sulfur compound gas and added with a gasified compound of the rare earth element.

Furthermore, according to second aspect of the invention, an emitting film is deposited with use of an element added with the rare earth element and to be sulfidized for the base material as a target in an atmosphere of a sputtering gas mixed with a sulfur compound gas.

Furthermore, according to third aspect of the invention, an emitting film is deposited with use of the sulfide base material as a target in an atmosphere of a sputtering gas added with a gasified compound of the rare earth element.

As the sulfide base material, it is possible to use SrS, CaS or ZnS. As the emitting center rare earth element, it is possible to use Ce, Eu, Pr, etc. As the sputtering gas, it is possible to use a general inert gas such as an Ar gas. As the sulfur compound mixed into the sputtering gas in the first or second method, it is possible to use $H_2S$, $CS_2$, $S(CH_3)_2$, $S(C_2H_5)_2$, etc. As the rare earth element compound added to the sputtering gas in the first or third method, it is possible to use (Ce compounds) such as $Ce(C_5H_5)_3$, $Ce(C_{11}H_{20}O_2)_3$, $Ce(OCH_3)_3$, Ce chloride, and Ce fluoride; (Eu compounds) such as $Eu(C_{11}H_{20}O_2)_3$, Eu chloride, Eu fluoride, and Eu sulfide; and (Pr compounds) such as $Pr(C_{11}H_{20}O_2)_3$, Pr chloride, Pr fluoride, and Pr sulfide. For example, these compounds can be heated to respective suitable temperatures so as to be gasified under supply of a carrier gas such as an Ar gas to thereby be put thereon.

Sputtering can be performed under general decompression of the order of several tens of mTorr. To attain film-producing speed adapted to mass production of large-area display panels, high frequency electric power for ionization of the sputtering gas is preferably selected to be at least 1 kW per one panel. The temperature of the substrate or panel as a subject of film production is selected to be in a range of from about 200° C. to 350° C. in order to attain improvement in quality of the resulting emitting film. Further, heat treatment is preferably performed under a temperature in accordance with the base material as usual in order to improve crystalline characteristic.

Paying attention to the fact that the problems in the conventional sputtering method using a rare earth element-including base material as a target are in that shortage of sulfur at the surface portion of the target is caused by the high vapor pressure of sulfur and in that the sputtering rate of the rare earth element is different from that of the base material, the problems are solved by mixing or supplying a sputtering gas with a sulfur compound and a rare earth element compound in the first method of the present invention, with a sulfur compound in the second method thereof or with a rare earth element compound in the third method, respectively in the form of a gas separately from the target.

That is, in the first method, a base material element containing no sulfur and no rare earth element is used as a target, and the target is subjected to sputtering in an atmosphere of a sputtering gas mixed or added with a sulfur compound and a rare earth element compound in a predetermined proportion, so that not only an emitting film can be produced at an exact stoichiometric rate of sulfide as the base material of the emitting film to thereby improve crystalline characteristic but the rare earth element can be added to the emitting film in an exact concentration and in a uniform concentration distribution. Alternatively, the second method is adapted to the case where the sputtering rate of the element to be sulfidized is not so different from that of the rare earth element. In the second method, a base material element containing no sulfur but added with a rare earth element is used as a target, and the target is subjected to sputtering in an atmosphere of a sputtering gas mixed with a sulfur compound gas in a predetermined proportion, so that an emitting film can be produced at an exact stoichiometric rate of the sulfide base material of the emitting film to thereby improve crystalline characteristic.

Further, the third method is adapted to the case where the vapor pressure of the base material element such as Ca is not so different from that of sulfur. In the third method, a sulfide base material is used as a target, and the target is subjected to sputtering in an atmosphere of a sputtering gas added with a rare earth element compound, so that the rare earth element can be added to the base material of the emitting film in an exact concentration and in a uniform concentration distribution.

DETAILED DESCRIPTION OF THE DRAWINGS

Figure 1:
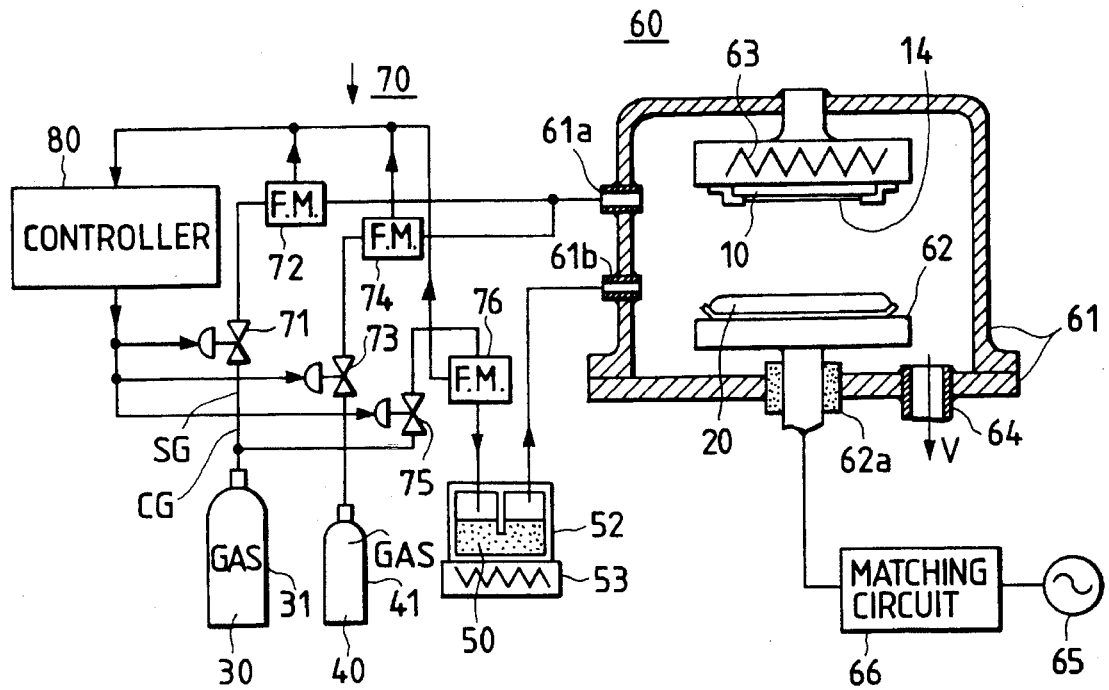
FIG. 1 is a structural view of a sputtering apparatus and related equipment adapted for carrying out the first method of producing an EL emitting film according to the present invention.
Figure 2:
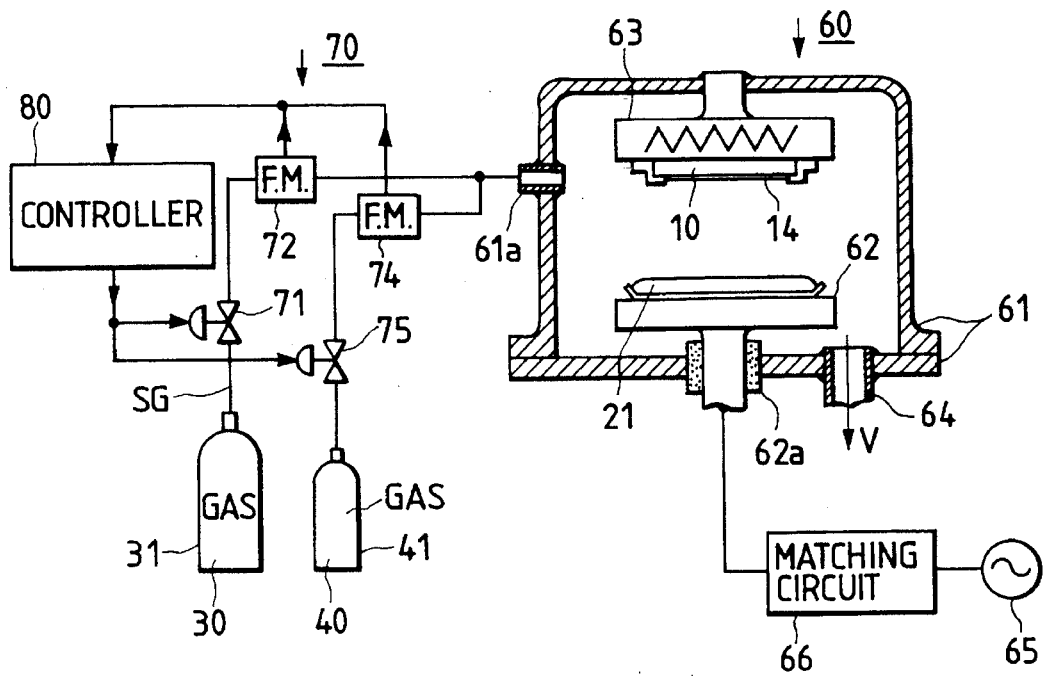
FIG. 2 is a structural view of a sputtering apparatus and related equipment adapted for carrying out the second method of producing an EL emitting film according to the present invention.
Figure 3:
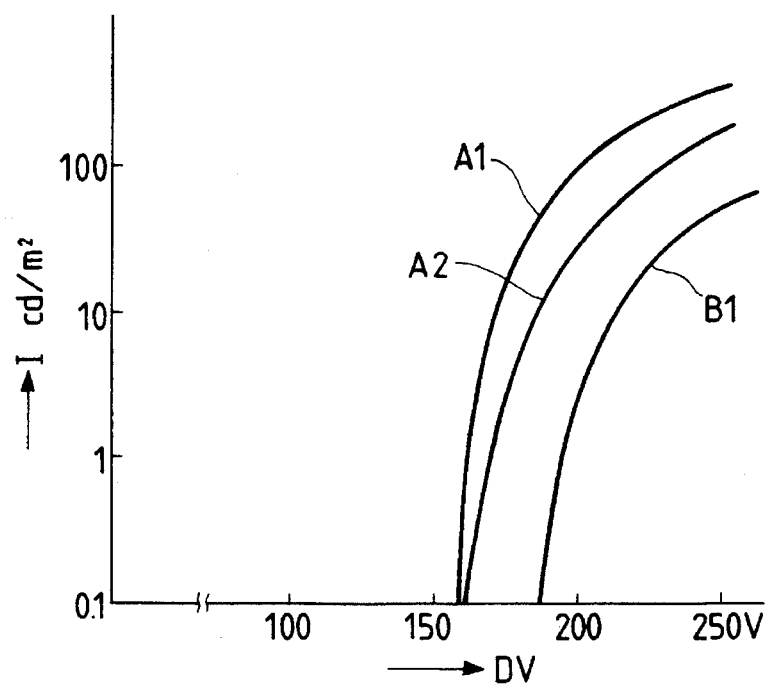
FIG. 3 is a characteristic graph showing emission characteristic of a display panel including the EL emitting film produced by the first or second film-producing method in comparison with emission characteristic according to a conventional method.
Figure 4:
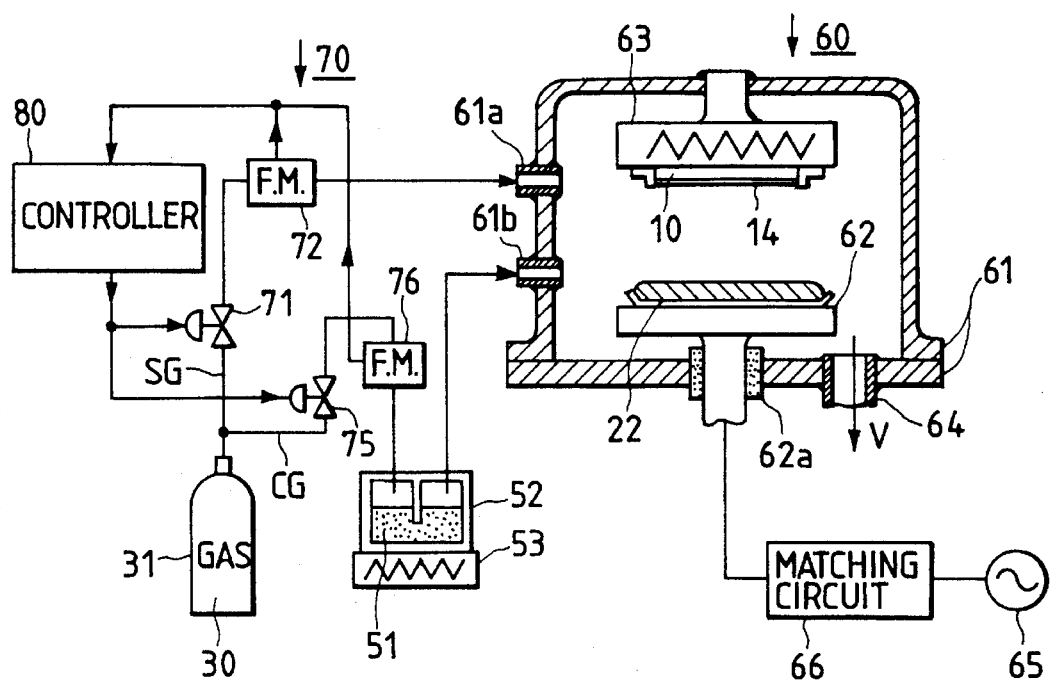
FIG. 4 is a structural view of a sputtering apparatus and related equipment adapted for carrying out the first method of producing an EL emitting film according to the present invention.
Figure 5:
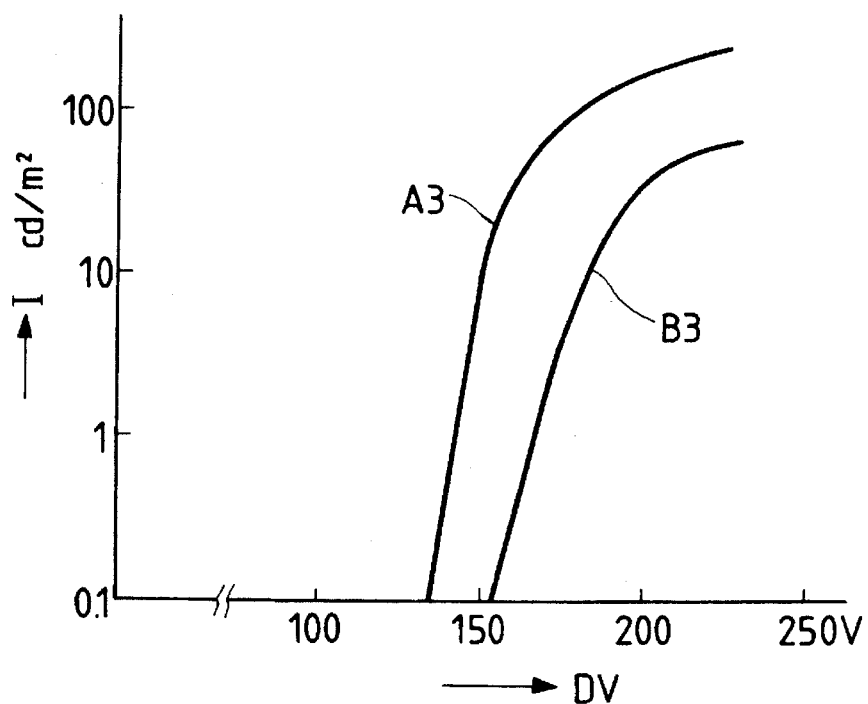
FIG. 5 is a characteristic graph showing emission characteristic of a display panel including the EL emitting film produced by the third film-producing method in comparison with emission characteristic according to a conventional method.

Embodiments of the present invention will be described below with reference to the drawings. FIGS. 1 and 2 are structural views showing a sputtering apparatus and related equipment for carrying out the first and second methods according to the present invention. FIG. 3 is a graph of characteristics of emitting films produced by the two methods. FIG. 4 is a structural view showing a sputtering apparatus and related equipment for carrying out the third method according to the present invention. FIG. 5 is a graph of characteristic of an emitting film produced by the third method.

Figure 6:
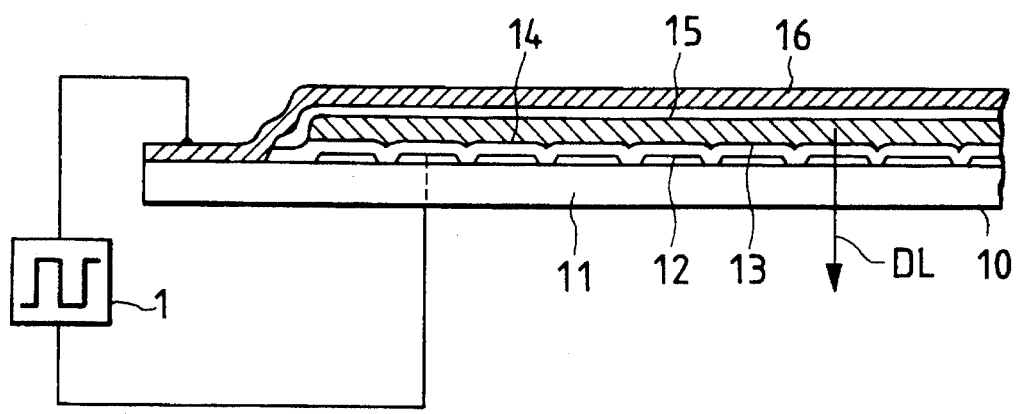
FIG. 6 is a sectional view of a display panel to which the method of producing an EL emitting film is applied.

A sputtering apparatus 60 shown in the right half of FIG. 1 can be used in common to the respective methods of from the first method to the third method. As usual, the sputtering apparatus 60 has a lower electrode 62 and an upper electrode 63 which are arranged within a closed chamber 61 so as to be opposite to each other, and the sputtering apparatus 60 is designed so that a gas can be introduced into the inside of the chamber 61 through introduction pipes 61a and 61b after the inside of the chamber 61 is led to a high vacuum V through a discharge pipe 64. The lower electrode 62 on which a target 20 is put is insulated from the chamber 61 by an insulator 62a and supplied with high frequency electric power from a high frequency electric source 65 through a matching circuit 66. The upper electrode 63 to which a display panel 10 of FIG. 6 is mounted has a heating means so that an emitting film 14 can be produced under the lower surface of the display panel 10 while the temperature of the display panel 10 is kept in a predetermined value.

As described above with reference to FIG. 6, before the emitting film 14 is produced, the display panel 10 is provided with transparent electrically conductive films such as ITO (indium tin oxide) films, for example, with the thickness of 0.2 µm, arranged as front-surface electrode films 12 on a transparent substrate 11 such as a glass substrate and covered with an insulating film 13 such as a silicon nitride film with the thickness of about 0.3 µm. After the emitting film 14 is produced, the display panel 10 is covered with an insulating film 15 such as a silicon nitride film with the thickness of 0.3 µm. Then, rear-surface electrode films 16 of aluminum, for example, with the thickness of 0.5 µm, are arranged after heat treatment is applied to the emitting film 14 to heat the emitting film 14 to a predetermined temperature. Thus, a thin-film lamination structure of the display panel 10 is completed as shown in FIG. 6.

The embodiment of FIG. 1 is adapted for production of an emitting film 14 containing Ce-including SrS as a base material and for performing EL emission of bluish green light with the wavelength of 450 nm. In the first method, a simple substance Sr which is an element to be sulfidized for the base material is used as a target. Further, sulfur S and a rare earth element Ce in the form of a compound gas are mixed or added to a sputtering gas which is selected to be an Ar gas as usual. A gas supply system 70 therefor is shown in the left side of the drawing. Argon 30 for sputtering gas SG is introduced into the chamber 61 through the introduction pipe 61a from a bottle 31 via a regulation valve 71 and a flow meter 72. Hydrogen sulfide 40 can be used as the sulfur compound. Hydrogen sulfide 40 is introduced into the chamber 61 through the introduction pipe 61a from a bottle 41 therefor through a regulation valve 73 and a flow meter 74 while mixed with the sputtering gas SG. As the sputtering gas SG, it is possible to use other inert gases than argon. As the sulfur source for the base material, it is possible to use other gasified compounds such as $CS_2$, $S(CH_3)_2$, $S(C_2H_5)_2$, etc. than hydrogen sulfide if necessary.

In this embodiment, tris-cyclopentadienyl-cerium $Ce(C_5H_5)_3$ is used as the rare earth element compound. This compound is gasified under supply of Ar 30 as a carrier gas CG thereto through a regulation valve 75 and a flow meter 76 while heated to 400° C. by a heating means 53 in a gas generator 52, so that the gasified compound is introduced into the chamber 61 through the introduction pipe 61b. Further, in this embodiment, a control computer 80 which is a simple micro-processor for controlling the gas supply system 70 is provided for controlling the regulation valves 71, 73 and 75 while monitoring detection values of the flow meters 72, 74 and 76. When, for example, the sputtering gas SG is supplied at a flow rate of 40 cc/min, the flow rate of hydrogen sulfide 40 is preferably controlled to be a value of about 15 cc/min. The flow rate of the carrier gas CG is controlled in accordance with the concentration of the rare earth element added to the base material of the emitting film 14. In this embodiment, the carrier gas CG is supplied at a flow rate of 5 cc/min in order to set the Ce concentration to 0.5 wt. %.

Production of the emitting film 14 by sputtering is carried out under the condition in which the temperature of the display panel 10 is kept in a value of about 300° C. by heating the upper electrode 63 as well as the atmospheric pressure in the chamber 61 is kept in a value of 15 mTorr. In the case where the display panel 10 has a large display area with the diagonal size of about 20 inches, high frequency electric power is selected to be not smaller than 1 kW. FIG. 3 shows the emission characteristic A1 of the display panel 10 produced by the first method in comparison with the characteristic B1 of a conventional panel. The Ce concentration in the base material of the emitting film 14 used in the first method is 0.5 wt. %. As a sample according to a conventional method, an emitting film having the same thickness is produced by a sputtering method with use of SrS added with Ce in the same concentration as a target. In FIG. 3, the abscissa axis expresses display voltage DV, and the ordinate axis expresses emission luminance I. As shown in the drawing, not only the emission threshold is reduced from 190 V of the conventional method to 160 V of the first method but an emission luminance of not lower than 200 $cd/m^2$ is attained by the first method while it is difficult to attain an emission luminance of 100 $cd/m^2$ by the conventional method.

The emitting film 14 of the display panel 10 having the emission characteristic A1 in FIG. 3 is analyzed. As a result, it is confirmed that the stoichiometric rate of Sr to S in the SrS base material is approximately 1. Further, it is proved from a result of X-ray diffraction that the crystalline characteristic of the base material is greatly more excellent than the conventional case. Further, it is thought of that the Ce content of the base material can be set to be about 0.5 wt. % as expected and that the thicknesswise concentration distribution of the emitting film 14 can be set to be sufficiently uniform. Because a sputtering method is used, the film-producing speed is high sufficiently to be adapted to mass production with no problem.

Although the above-mentioned embodiment shows the case where $Ce(C_5H_5)_3$ is used as the rare earth element source, the invention can be applied to the case where a cerium organic compound such as $Ce(C_{11}H_{20}O_2)_3$, $Ce(OCH_3)_3$, etc., Ce chloride or Ce fluoride is alternatively used as the rare earth element source. Also in the case where Eu or Pr is used as the rare earth element, $Eu(C_{11}H_{20}O_2)_3$ or $Pr(C_{11}H_{20}O_2)_3$ can be used as tris-dipivaloyl-methanate of Eu or Pr in the same manner as in the case of Ce. Alternatively, chloride, fluoride, sulfide, etc. of Eu or Pr can be used. It is a matter of course that the heating temperatures for gasifying these elements are set respectively in accordance with the kind of the compound.

FIG. 2 shows an embodiment of the second method. Also in this embodiment, an emitting film 14 containing Ce-including SrS as a base material is produced. In the second method, an element Sr added with a rare earth element Ce and to be sulfidized for the base material is used as a target, and a sputtering gas SG is mixed with sulfur for the base material in the form of a compound such as $H_2S$. A gas supply system 70 of FIG. 2 for supplying argon 30 for the sputtering gas SG and hydrogen sulfide 40 is shown as a simplification of the structure of FIG. 1, so that the description thereof will be omitted. Also in the second method, another element Eu or Pr than Ce can be used as the rare earth element. In this embodiment, Sr containing 0.2% of Ce is used as a target 21, 25% of $H_2S$ is mixed with the sputtering gas SG, and an emitting film 14 is produced by sputtering with high frequency electric power of 2 kW under the condition of the temperature of the panel 10 of 300° C. and the atmospheric pressure of 15 mTorr in the same manner as in the previous embodiment.

FIG. 3 shows the emission characteristic A2 of the display panel 10 on which the emitting film 14 with the thickness of 0.6 μm is produced in the above-mentioned embodiment. It is apparent from this drawing that the second method can stand comparison with the first method in the point of view of the emission threshold but the second method is inferior to the first method in the point of view of the emission luminance I because the amount of addition of Ce as an emitting center element in the second method is smaller than that in the first method. The emission luminance I obtained by the second method is however higher than that observed from the emission characteristic B1 of the conventional method in which the amount of addition of Ce is relatively large. That is, the second method can perform display with the luminance of 100 cd/m$^2$. In the second method, it is difficult to increase the amount of addition of Ce to a value used in the first method, but there is an advantage in that film production can be carried out easily. The target used in the second method can be prepared easily in the form of an alloy of Sr and a rare earth element or in the form of a mixture sintered matter of Sr and a rare earth element or a compound of a rare earth element.

FIG. 4 shows an embodiment of the third method. In the third method, a base material of sulfide is used as a target, and a gasified compound of a rare earth element is added to the sputtering gas. In this embodiment, an emitting film 14 containing Eu-including CaS as the base material is produced for performing EL emission of red light with the wavelength of 660 nm. That is, the base material CaS is used as a target 22, and europium chloride as an Eu compound is added to the sputtering gas SG. Therefore, the sputtering gas SG of Ar is supplied, for example, at a flow rate of 30 cc/min from the gas supply system 70, and a carrier gas CG is supplied at a flow rate of about 3 cc/min to europium chloride 51 heated to 600° C. in the gas generator 52 to thereby gasify europium chloride 51 to be added to the sputtering gas SG.

The emitting film 14 produced by sputtering under the condition of the temperature of the display panel 10 heated to about 250° C. and the atmospheric pressure of about 20 mTorr. FIG. 5 shows the emission characteristic A3 of the display panel 10 on which the emitting film 14 having the Eu concentration of 0.1 wt. % and having a thickness of 0.6 μm is produced in this embodiment. The characteristic B3 of the comparative example is in the case where an emitting film of the same thickness is produced by a conventional method with use of CaS containing Eu of the same concentration as a target. According to the third method, it is apparent from this drawing that the emission threshold is reduced from 155 V of the conventional case to 140 V or smaller and that display can be performed with a high luminance of 200 cd/m$^2$ though the emission luminance of 100 cd/m$^2$ is difficult conventionally. Use of the third method is limited to the case where the vapor pressure of the element to be sulfidized is not so different from that of sulfur, but there is an advantage in that film production can be carried out easier than the case of the first method. It is a matter of course that another element such as Ce or Pr than Eu described above can be used as the rare earth element.

As described above, in the first method of the present invention, an element to be sulfidized for a base material is used as a target, and a sputtering gas is mixed with a sulfur compound gas and added with a gasified compound of a rare earth element. In the second method, an element added with a rare earth element and to be sulfidized for a base material is used as a target, and a sputtering gas is mixed with a sulfur compound gas. In the third method, a base material of sulfide is used as a target, and a sputtering gas is added with a gasified compound of a rare earth element. In any one of the methods according to the present invention, an EL emitting film is produced by a sputtering method. Accordingly, the following effects can be attained by the methods respectively.

In the first method, because each of sulfur for a base material and a rare earth element for an emitting center element can be supplied in the form of a compound gas in accordance with the film-producing speed, not only an emitting film can be produced at an exact stoichiometric rate of sulfide as the base material of the emitting film to thereby improve crystalline characteristic but the rare earth element can be added to the emitting film in an exact concentration and in a uniform concentration distribution.

The second method is adapted to the case where the sputtering rate of the element to be sulfidized is not so different from that of the rare earth element. By supplying sulfur for the base material in the form of a compound gas in accordance with the film-producing speed, an EL emitting film can be produced at an exact stoichiometric rate of the sulfide base material of the EL emitting film to thereby improve crystalline characteristic.

The third method is adapted to the case where the vapor pressure of the element for the base material is not so different from that of sulfur. By supplying the rare earth element for the emitting center element in the form of a compound gas in accordance with the film-producing speed, the rare earth element can be added to the EL emitting film in an exact concentration and in a uniform concentration distribution.

In any one of the methods according to the present invention, there arises an effect that an EL emitting film having a higher emission luminance than the conventional case can be produced. Accordingly, any one of the methods is adapted to mass production of EL display panels because not only a large-area emitting film can be produced so as to be uniform in film thickness and film quality but the film-producing speed is high. The method of the present invention is particularly adapted to film production in the case where various emission light colors are given to the EL emitting film through selection of the base material and the emitting center element. Accordingly, the emission luminance is improved compared with the conventional case to thereby overcome the conventional difficult point, so that the invention can contribute to greater widening of use of EL display panels.

What is claimed is:

1. A method of producing an electroluminescence emitting film comprising:

sputtering an elemental target in a reactive atmosphere, wherein said target comprises an element to be sulfidized and said reactive atmosphere comprises an inert sputtering gas, a sulfur compound gas and a gasified compound of a rare earth element;

reactively depositing an electroluminescence emitting film including said rare earth and sulfur from said reactive atmosphere.

2. A method of producing an electroluminescence emitting film as claimed in claim 1, wherein said electroluminescence emitting film includes a material selected from a group consisting of SrS, CaS, and ZnS.

3. A method of producing an electroluminescence emitting film as claimed in claim 1, wherein said rare earth element as an emitting center is selected from a group consisting of Ce, Eu, and Pr.

4. A method of producing an electroluminescence emitting film as claimed in claim 1, said sulfur compound gas to be mixed with said inert sputtering gas is selected from a group consisting of $H_2S$, $CS_2$, $S(CH_3)_2$, and $S(C_2H_5)_2$.

5. A method of producing an electroluminescence emitting film as claimed in claim 3, wherein said compound of said rare earth element is selected from a group consisting of Ce compounds, Eu compounds and Pr compounds.

6. A method of producing an electroluminescence emitting film as claimed in claim 5, wherein said compound of said rare earth element is selected from a group consisting $Ce(C_5H_5)_3$, $Ce(C_{11}H_{20}O_2)_3$, $Ce(OCH_3)_3$, Ce chloride, Ce fluoride, $Eu(C_{11}H_{20}O_2)_3$, Eu chloride, Eu fluoride, Eu sulfide, $Pr(C_{11}H_{20}O_2)_3$, Pr chloride, Pr fluoride, and Pr sulfide.

* * * * *